United States Patent
Shin et al.

(10) Patent No.: US 7,020,031 B2
(45) Date of Patent: Mar. 28, 2006

(54) SYNCHRONOUS SEMICONDUCTOR MEMORY DEVICES AND DATA STROBE INPUT BUFFERS WITH AN INPUT BUFFER CIRCUIT AND A DETECTION CIRCUIT FOR BUFFERING DATA THERETO

(75) Inventors: Won-hwa Shin, Chungcheongnam-do (KR); Seong-jin Jang, Gyeonggi-do (KR); Sang-joon Hwang, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/011,549

(22) Filed: Dec. 14, 2004

(65) Prior Publication Data

US 2005/0152209 A1    Jul. 14, 2005

(30) Foreign Application Priority Data

Jan. 8, 2004    (KR) ..................... 10-2004-0001104

(51) Int. Cl.
*G11C 7/00*    (2006.01)

(52) U.S. Cl. .................. 365/193; 365/100; 365/230.08

(58) Field of Classification Search ............... 365/193, 365/100, 191, 230.08
See application file for complete search history.

(56) References Cited

U.S. PATENT DOCUMENTS 6,529,422 B1 *   3/2003   Mazumder et al. .... 365/189.09
6,819,602 B1 *  11/2004   Seo et al. ................ 365/193

FOREIGN PATENT DOCUMENTS

| KR | 000027382    | 5/2000 |
| KR | 010004958    | 1/2001 |
| KR | 2001-195884  | 7/2001 |

* cited by examiner

*Primary Examiner*—Richard Elms
*Assistant Examiner*—Dang T. Nguyen
(74) *Attorney, Agent, or Firm*—Myers Bigel Sibley & Sajovec, PA

(57) ABSTRACT

A synchronous semiconductor memory device includes a data input buffer and a data strobe input buffer. The data strobe input buffer includes an input buffer circuit and a detection circuit. The input buffer circuit is configured to be enabled based on an active signal, and to compare a data strobe signal with a first reference voltage to generate an internal data strobe signal. The detection circuit is configured to be enabled based on the active signal, and to compare the data strobe signal with a second reference voltage to generate a detection signal for enabling the data input buffer.

17 Claims, 8 Drawing Sheets

SYNCHRONOUS SEMICONDUCTOR MEMORY DEVICES AND DATA STROBE INPUT BUFFERS WITH AN INPUT BUFFER CIRCUIT AND A DETECTION CIRCUIT FOR BUFFERING DATA THERETO

RELATED APPLICATION

This application claims priority under 35 U.S.C. § 119 to Korean Patent Application No. 10-2004-0001104, filed on Jan. 8, 2004, in the Korean Intellectual Property Office, the disclosure of which is herein incorporated by reference in its entirety.

1. Field of the Invention

The present invention relates to synchronous semiconductor memory devices, and more particularly, to buffering data input thereto.

2. Background of the Invention

Computer systems can have a hierarchy of semiconductor memory devices, which can operate at different data input and output (I/O) speeds. The operational speed of a computer system can be constrained by the I/O speed of its memory devices. Accordingly, there is significant interest in increasing the I/O speed of semiconductor memory devices.

One type of memory device is a synchronous dynamic random access memory device (SDRAM). A SDRAM device can include an internal circuit that controls memory operations synchronously with clock signals of a computer system. Two types of SDRAM devices are single data rate (SDR) SDRAM and double data rate (DDR) SDRAM. A SDR SDRAM device may input or output one data word per clock cycle, such as in response to a rising edge or a falling edge of the clock signal. A DDR SDRAM device may input or output two data words per clock cycle, such as in response to a rising edge and a falling edge of the clock signal. Accordingly, the I/O speed (bandwidth) of a DDR SDRAM device may be twice that of a SDR SDRAM device.

Because the corresponding data I/O window of a DDR SDRAM device is relatively smaller than that of the SDR SDRAM, a DDR SDRAM device may use a data strobe signal which fetches the I/O data. The DDR SDRAM may include an extra pin for the data strobe signal.

FIG. 1 is a block diagram of a conventional synchronous semiconductor memory device 100. The synchronous semiconductor memory device 100 includes a data strobe input buffer 110, a data input buffer 120, a command decoder 130, a latch circuit 140, and a memory cell array 150.

The data strobe input buffer 110 is enabled in response to an active signal PACTIVE and compares the data strobe signal DS with a reference voltage VREF to generate a delayed internal data strobe signal PDS. The data strobe signal DS is input by an external device such as, for example, a central processing unit.

The data input buffer 120 is enabled in response to a write signal PWRITE and buffers an input data DIN from an external device to generate a first internal input data PDIN.

The command decoder 130 decodes commands COMMAND from an external device to generate an active signal PACTIVE and a write signal PWRITE. The commands are synchronized with a clock signal CLOCK. The synchronous semiconductor memory device 100 is activated by the active signal PACTIVE, and the input data PDIN is written to memory cells in a memory cell array 150 based on the write signal PWRITE.

The latch circuit 140 latches the first internal input data PDIN in response to a rising edge and a falling edge of the internal data strobe signal PDS and outputs a second internal input data DATA. The second internal input data DATA is written to the memory cells in the memory cell array 150.

FIG. 2 is a timing diagram of exemplary operations of the synchronous semiconductor memory device 100 shown in FIG. 1. FIG. 2 may correspond to an embodiment of the synchronous semiconductor memory device 100 that operates at a relatively low frequency and with the input data DIN having a burst length of 4. A clock signal CLOCK has a period that corresponds to a relatively large value tCC1.

Operation of the synchronous semiconductor memory device 100 will be further described with reference to FIGS. 1 and 2. When an active command ACTIVE COMMAND is input synchronously with a rising edge of a first cycle C1 of the clock signal CLOCK, the active signal PACTIVE is activated to a high level. The data strobe input buffer 110 then buffers a data strobe signal DS to generate a delayed internal data strobe signal PDS.

The data strobe signal DS transitions from a high impedance (Hi-Z) state to a low level during a time interval PA, switches four times between a high level and a low level every half period, and then transitions to the high impedance (Hi-Z) state. The time interval "PA" refers to a preamble time interval. The input data DIN is input from an external device synchronously with rising and falling edges of the data strobe signal DS.

When the write command is input synchronously with a rising edge of a third cycle C3 of the clock signal CLOCK, the write signal PWRITE is activated to a high level for a predetermined time period. The data input buffer 120 then buffers the input data DIN to generate a delayed first internal input data PDIN. The first internal input data PDIN is latched by rising and falling edges of the internal data strobe signal PDS.

Because the write signal PWRITE that enables the data input buffer 120 is transitioned to a high level before the data strobe signal DS is transitioned to a high level, which is illustrated in FIG. 2 within time period "A", the first internal input data PDIN can be normally written to the memory cells of the memory cell array 150.

FIG. 3 is a timing diagram that illustrates an error that may occur with the synchronous semiconductor memory device 100 shown in FIG. 1. FIG. 3 may correspond to an embodiment of the synchronous semiconductor memory device 100 that operates at a relatively high frequency and with the input data DIN having a burst length of 4. Accordingly, the clock signal CLOCK shown in FIG. 3 has a period tCC2 that is smaller than the period tCC1 of the clock signal CLOCK shown in FIG. 2.

Operation of the semiconductor memory device 100 will now be further described with reference to FIGS. 1 and 3. When an active command ACTIVE COMMAND is input synchronously with a rising edge of a first cycle C1 of the clock signal CLOCK, the active signal PACTIVE is activated to a high level. The data strobe input buffer 110 then buffers a data strobe signal DS to generate a delayed internal data strobe signal PDS.

The data strobe signal DS transitions from a high impedance (Hi-Z) state to a low level during a time interval PA, switches four times between a high level and a low level every half period, and then transitions to a high impedance (Hi-Z) state. As described above, the time interval "PA" refers to a preamble time interval, and the input data DIN is input from an external device synchronously with rising and falling edges of the data strobe signal DS.

When the write command WRITE COMMAND is input synchronously with a rising edge of a third cycle C3 of the clock signal CLOCK, the write signal PWRITE is activated to a high level for a predetermined time period. The data input buffer 120 then buffers the input data DIN to generate a delayed first internal input data PDIN. The first internal input data PDIN is latched by rising and falling edges of the internal data strobe signal PDS.

The increased rate of the clock CLOCK of FIG. 3 relative to that of FIG. 2, and the corresponding increase in operational speed of the synchronous semiconductor memory device 100, causes a corresponding increase in the frequencies of the data strobe signal DS and the input data DIN. However, the time when the write signal PWRITE is activated to a high level, after the write command WRITE COMMAND is applied, may remain constant and independent of the rate of the clock CLOCK, data strobe signal DS, and input data DIN. Consequently, because the time when the write signal PWRITE is transitioned to a high level follows the time when the data strobe signal DS, synchronous with the input data DIN, is transitioned to a high level, the first input data D1 of the first internal input data PDIN may be not generated, which is illustrated in FIG. 3 within time period "B". As a result, the first input data D1 of the first internal input data PDIN may be not latched by the rising edge of the internal data strobe signal PDS. Consequently, the synchronous semiconductor memory device 100 may develop errors as its operating frequency is increased.

SUMMARY OF THE INVENTION

In some embodiments of the present invention, a synchronous semiconductor memory device includes a data input buffer and a data strobe input buffer. The data strobe input buffer includes an input buffer circuit and a detection circuit. The input buffer circuit is configured to be enabled based on an active signal, and to compare a data strobe signal with a first reference voltage to generate an internal data strobe signal. The detection circuit is configured to be enabled based on the active signal, and to compare the data strobe signal with a second reference voltage to generate a detection signal for enabling the data input buffer.

In some further embodiments of the present invention, the second reference voltage may have a lower voltage level than the data strobe signal. The second reference voltage may have a lower voltage level than the first reference voltage. The input buffer circuit and the detection circuit may each comprise a differential amplifier with input terminals and an output terminal. The differential amplifier in the input buffer circuit may generate the internal data strobe signal through its output terminal based on the data strobe signal and the first reference voltage applied to its input terminals. The differential amplifier in the detection circuit may generate the detection signal through its output terminal based on the data strobe signal and the second reference voltage applied to its input terminals.

In some other embodiments of the present invention, a synchronous semiconductor memory device includes a data strobe input buffer, a first latch circuit, a data input buffer, a second latch circuit, and a memory cell array. The data strobe input buffer is configured to be enabled based on an active signal, to compare a data strobe signal with a first reference voltage to generate an internal data strobe signal, and to compare the data strobe signal with a second reference voltage to generate a detection signal. The first latch circuit is configured to latch the detection signal, and to output an enable signal. The data input buffer is configured to be enabled based on the enable signal, and to buffer input data to generate a first internal input data. The second latch circuit is configured to latch the first internal input data in response to rising and falling edges of the internal data strobe signal to output second internal input data. The memory cell array comprises memory cells, and the second internal input data are written into the memory cells.

In some other embodiments of the present invention, a synchronous semiconductor memory device includes a logic circuit, a data input buffer, a latch circuit, and a memory cell array. The data strobe input buffer is configured to be enabled based on an active signal, to compare a data strobe signal with a first reference voltage to generate an internal data strobe signal, and to compare the data strobe signal with a second reference voltage to generate a detection signal. The logic circuit is configured to generate an enable signal based on the detection signal and a write signal. The data input buffer is configured to be enabled based on the enable signal, and to buffer input data to generate a first internal input data. The latch circuit is configured to latch the first internal input data in response to rising and falling edges of the internal data strobe signal to output second internal input data. The memory cell array includes memory cells, and the second internal input data are written into the memory cells.

The logic circuit may be configured to activate the enable signal based on activation of the detection signal, to maintain activation of the enable signal based on activation of the write signal, and to deactivate the enable signal based on inactivation of the write signal. The logic circuit may include a NAND gate or a NOR gate.

DETAILED DESCRIPTION

Figure 1:
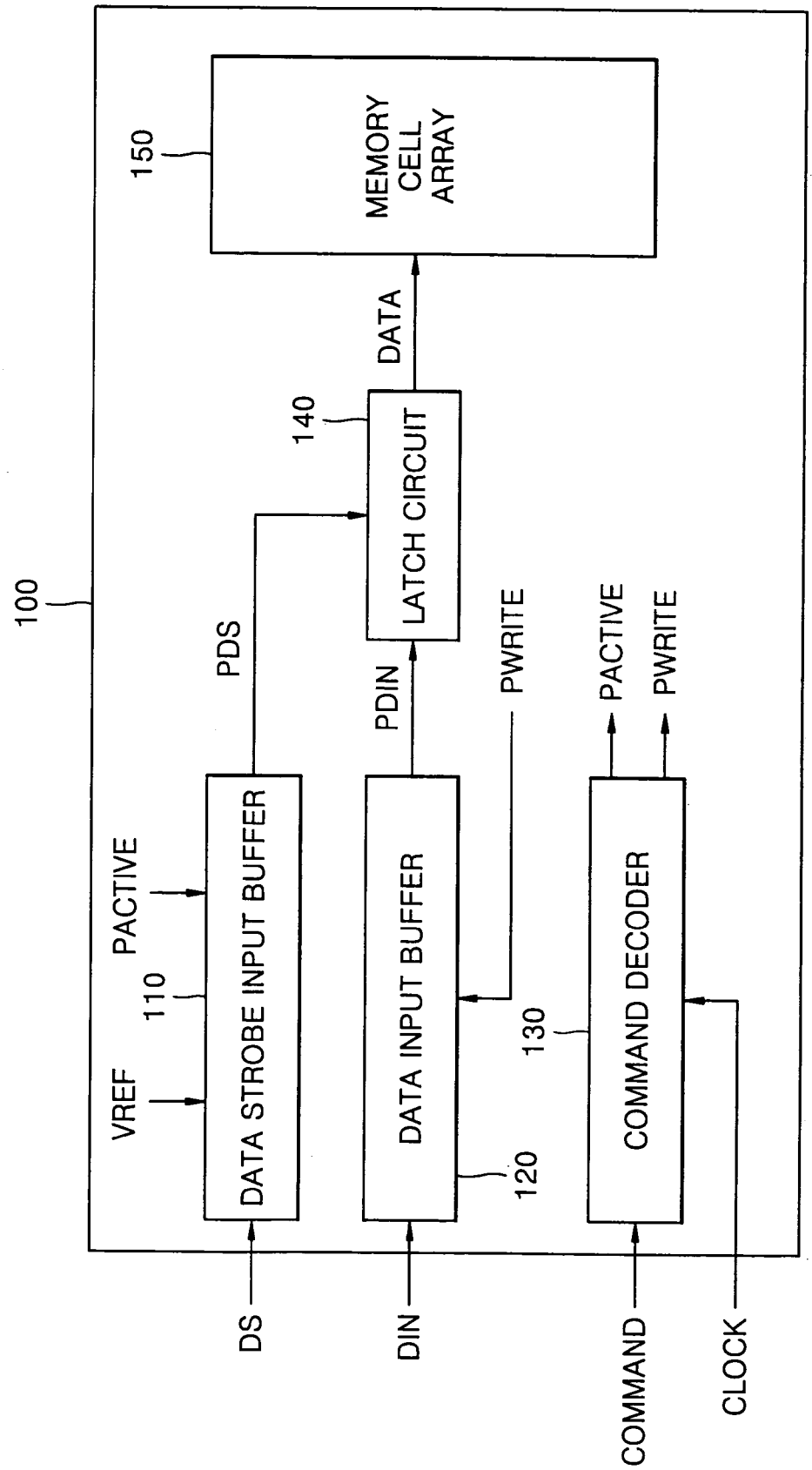
FIG. 1 is a block diagram of a conventional synchronous semiconductor memory device.

Certain embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of regions may be exaggerated for clarity. It will be understood that when an element is referred to as being "on", "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
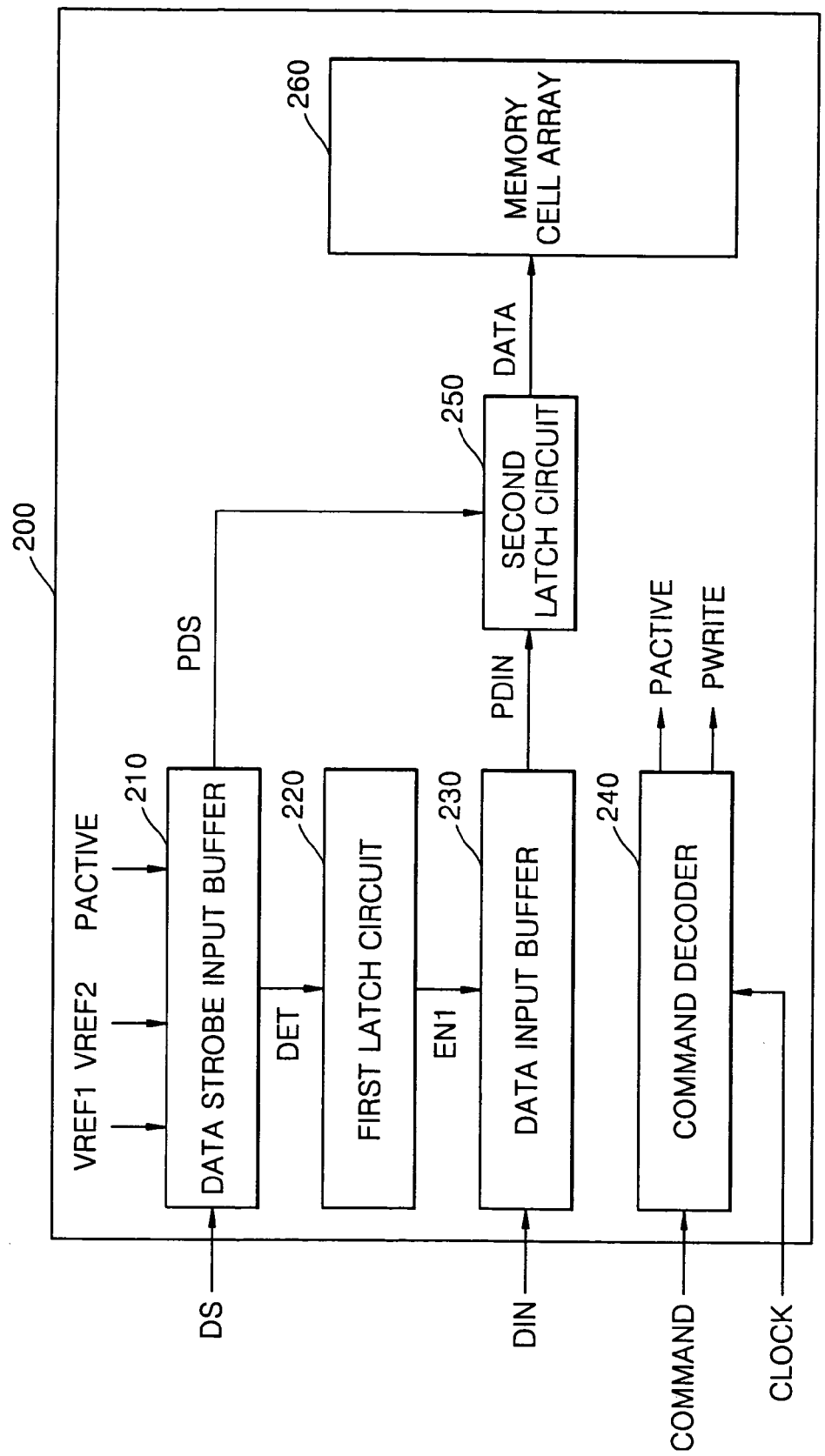
FIG. 4 is a block diagram of a synchronous semiconductor memory device according to a first embodiment of the present invention.

FIG. 4 is a block diagram of a synchronous semiconductor memory device 200 according to a first embodiment of the present invention. Referring to FIG. 4, the synchronous semiconductor memory device 200 comprises a data strobe input buffer 210, a first latch circuit 220, a data input buffer 230, a command decoder 240, a second latch circuit 250, and a memory cell array 260.

The data strobe input buffer 210 is enabled based on an active signal PACTIVE, and compares a data strobe signal DS input from an external device, such as, a central processing unit with a first reference voltage VREF1 to generate a delayed internal data strobe signal PDS. In addition, the data strobe input buffer 210 is enabled based on the active signal PACTIVE, and then compares the data strobe signal DS with a second reference signal VREF2 to generate a detection signal DET.

The first and second reference voltages VREF1 and VREF2 can be generated by a reference voltage generator (not shown) included in the synchronous semiconductor memory device 200. The second reference voltage VREF2 can have a lower voltage level than the first reference voltage VREF1 and the data strobe signal DS.

The first latch circuit 220 latches the detection signal DET and outputs an enable signal EN1. The data input buffer 230 buffers input data DIN, input from external to the synchronous semiconductor memory device 200, based on activation of the enable signal EN1 and generates a delayed first internal input data PDIN.

Therefore, in accordance with some embodiments of the present invention, a synchronous semiconductor memory device may not enable the data input buffer 230 based on a write signal PWRITE, but instead enables the data input buffer 230 based on a low level of the data strobe signal DS. Activating the data input buffer 230 is this manner may allow the input data DIN to be correctly written into memory cells of the memory cell array 260 at higher operating frequencies than may be possible with the synchronous semiconductor memory device 100 shown in FIG. 1.

The command decoder 240 decodes externally input commands COMMAND and generates an active signal PACTIVE and a write signal PWRITE. The commands COMMAND are synchronized with a clock signal CLOCK. The active signal PACTIVE activates the synchronous semiconductor memory device 200, and the write signal PWRITE controls the input data PDIN to be written to memory cells (not shown in the drawing) in a memory cell array 260.

The second latch circuit 250 latches the first internal input data PDIN and outputs a second internal input data DATA in response to rising and falling edges of the internal data strobe signal PDS. The second internal input data DATA are written into memory cells in a memory cell array 260.

Figure 2:
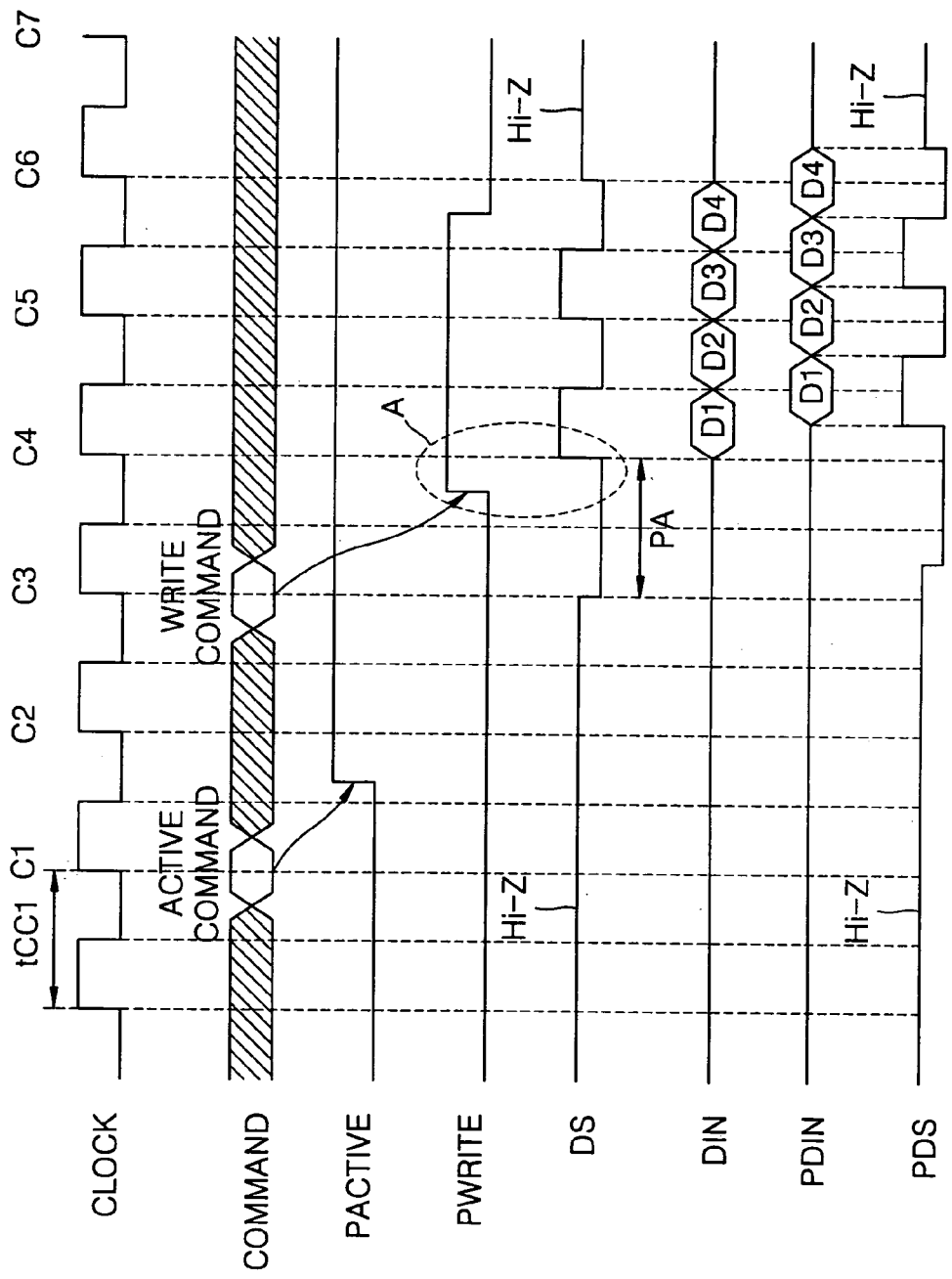
FIG. 2 is a timing diagram of exemplary operations of the synchronous semiconductor memory device shown in FIG. 1.
Figure 3:
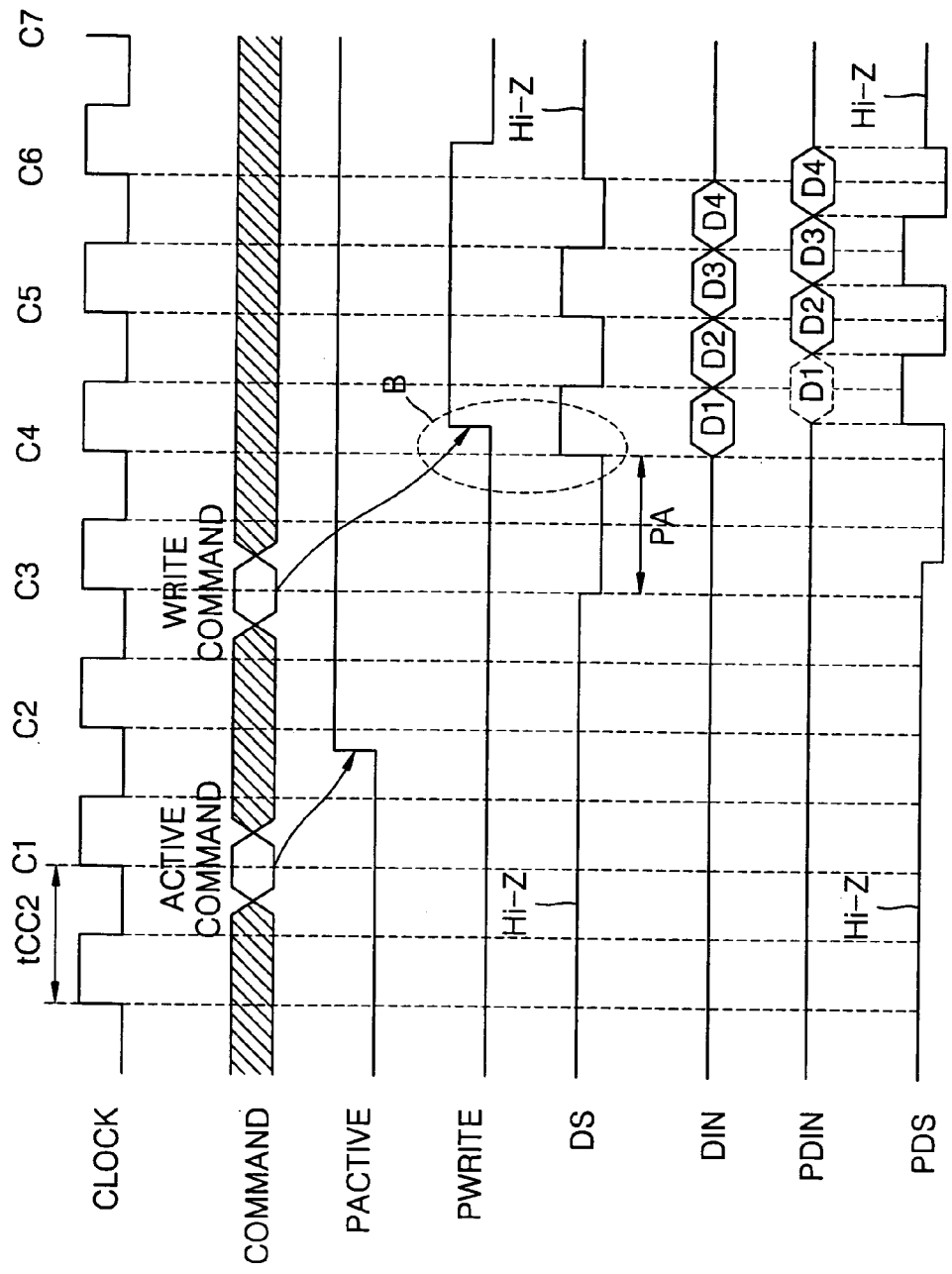
FIG. 3 is a timing diagram of exemplary operations the synchronous semiconductor memory device shown in FIG. 1, but at a higher clock frequency than those shown in FIG. 2.
Figure 5:
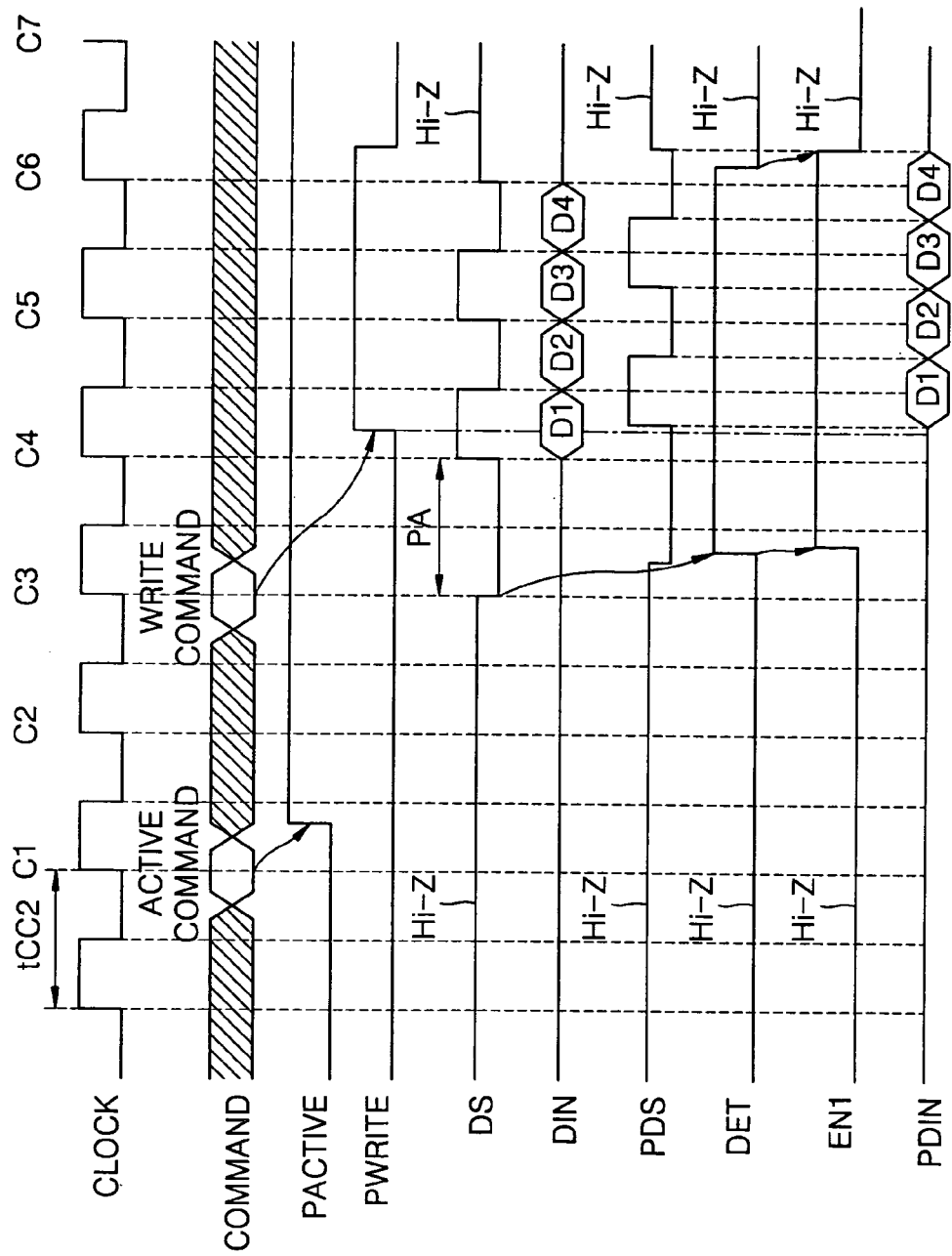
FIG. 5 is a timing diagram of exemplary operations of the synchronous semiconductor memory device shown in FIG. 4, in accordance with some embodiments of the present invention.

FIG. 5 is a timing diagram showing exemplary operations of the synchronous semiconductor memory device 200 shown in FIG. 4, in accordance with some embodiments of the present invention. FIG. 5 may correspond to an embodiment of the synchronous semiconductor memory device 200 that operates at a high frequency and with the input data DIN having a burst length of four. Accordingly, the clock signal CLOCK shown in FIG. 5 has a period tCC2 that is smaller than the period tCC1 of the clock signal CLOCK shown in FIG. 2.

Operation of the synchronous semiconductor memory device 200 will now be further described with reference to FIGS. 4 and 5. When an active command is input synchronously with a rising edge of a first cycle C1 of the clock signal CLOCK, the active signal PACTIVE is activated to a high level. The data strobe input buffer 210 then buffers the data strobe signal DS and generates a delayed internal data strobe signal PDS.

The data strobe signal DS transitions from a high impedance (Hi-z) state to a low level during a preamble time interval PA, switches four times between a high level and a low level every a half period, and then transitions to the high impedance (Hi-z) state. Here, the time interval PA is a preamble time interval. The input data DIN is input from external to the synchronous semiconductor memory device 200 synchronously with the rising and falling edges of the data strobe signal DS.

The detection signal DET is activated to a high level based on the data strobe signal DS having a low level in the preamble time interval PA. The detection signal DET is transitioned to a high impedance (Hi-z) state when the data strobe signal DS is transitioned to a high impedance (Hi-z) state.

The enable signal EN1 is generated by latching the detection signal DET. The enable signal EN1 enables the data input buffer 230. The enabled data input buffer 230 buffers the input data DIN and generates delayed first internal input data PDIN. The first internal input data PDIN are latched by rising and falling edges of the internal data strobe signal PDS.

The write signal PWRITE is activated to a high level for a predetermined time period when the write command is input synchronously with a rising edge of a third clock cycle C3 of the clock signal CLOCK. Because the synchronous semiconductor memory device 200 generates the enable signal EN1 which enables the data input buffer 230, even at a relatively higher frequency, the input data DIN may be more accurately written into memory cells of a memory cell array 260.

Figure 6:
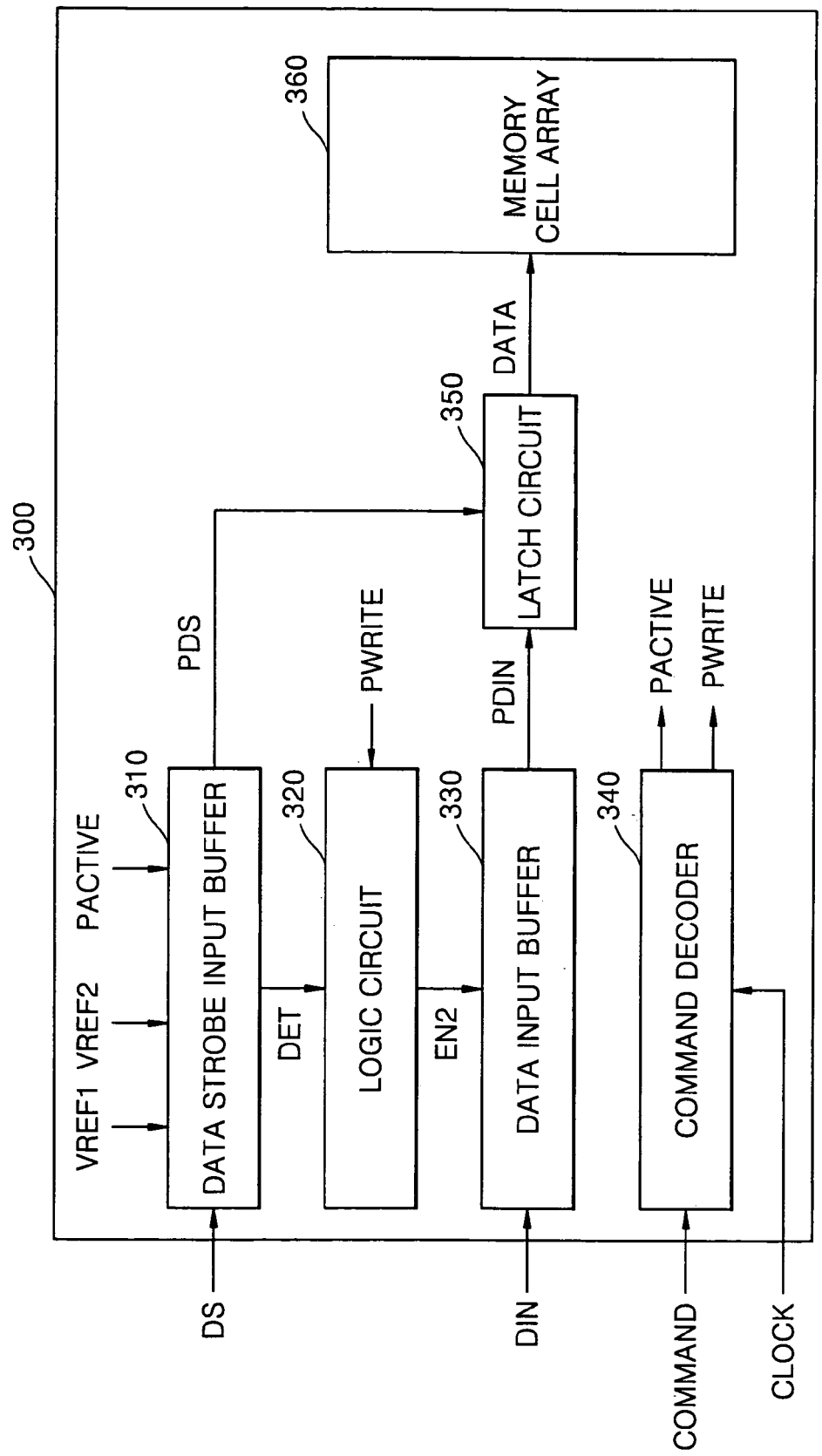
FIG. 6 is a block diagram of a synchronous semiconductor memory device according to a second embodiment of the present invention.

FIG. 6 is a block diagram of a synchronous semiconductor memory device 300 according to a second embodiment of the present invention. The synchronous semiconductor memory device 300 includes a data strobe input buffer 310, a logic circuit 320, a data input buffer 330, a command decoder 340, a latch circuit 350, and a memory cell array 360.

The data strobe input buffer 310 is enabled based on an active signal PACTIVE and compares a data strobe signal DS input from an external device with a first reference voltage VREF1 to generate a delayed internal data strobe signal PDS. In addition, a data strobe input buffer 310 is enabled based on the active signal PACTIVE, and then compares the data strobe signal DS with a second reference voltage VREF2 to generate a detection signal DET.

The first and second reference voltages VREF1 and VREF2 can be generated by a reference voltage generator (not shown in the drawing) included in the synchronous semiconductor memory device 300. The level of the second reference voltage VREF2 is relatively lower than the level of the first reference voltage VREF1 and the low level of the data strobe signal.

The logic circuit 320 generates an enable signal EN2 in response to the detection signal DET and the write signal PWRITE. The enable signal EN2 starts to be activated by activation of the detection signal DET, maintains the activation of the enable signal EN2 by activation of the write signal PWRITE, and is inactivated by inactivation of the write signal PWRITE. The logic circuit 320 may include a NAND or NOR gate.

The data input buffer 330 buffers input data DIN from an external device in response to the enable signal EN2 and generates a delayed first internal input data PDIN.

As a consequence, because the synchronous semiconductor memory device 300 uses the low voltage level of the data strobe signal DS to enable the data input buffer 330, the input data DIN may be more written more accurately into memory cells of a memory cell array 360 while operating at a relatively high frequency than may be possible with the synchronous semiconductor memory device 100 shown in FIG. 1.

The command decoder 340 decodes commands COMMAND, input from an external device, to generate the active signal PACTIVE and the write signal PWRITE. The commands are synchronized with a clock signal CLOCK. The active signal PACTIVE activates the synchronous semiconductor memory device 300, and the write signal PWRITE controls the writing of the input data PDIN into memory cells of a memory cell array 360.

The latch circuit 350 latches the first internal input data PDIN in response to rising and falling edges of the internal data strobe signal PDS and outputs second internal input data DATA. The second internal input data DATA are written into memory cells of a memory cell array 360.

Figure 7:
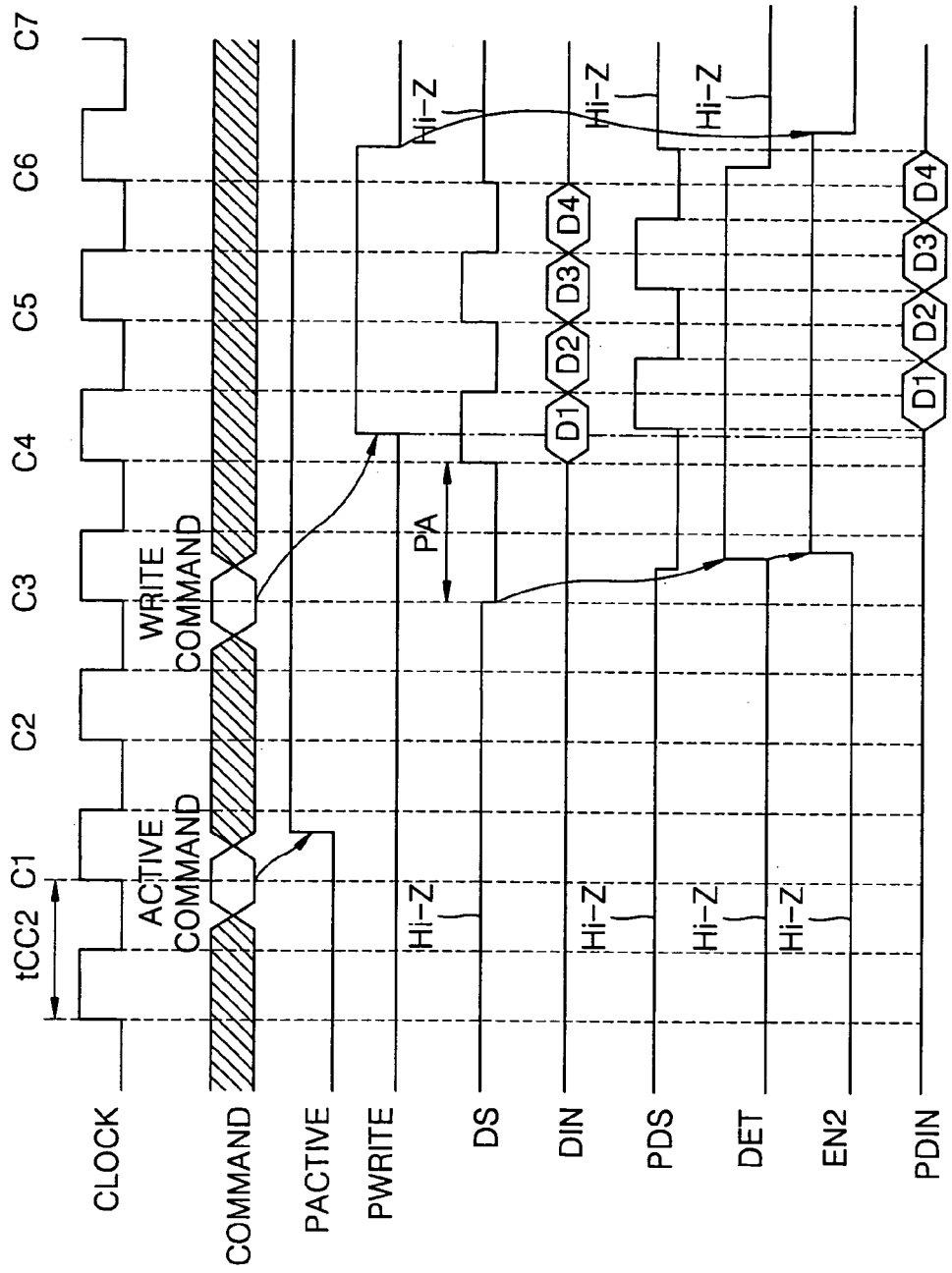
FIG. 7 is a timing diagram of exemplary operations of the synchronous semiconductor memory device show in FIG. 6.

FIG. 7 is a timing diagram showing exemplary operations of the synchronous semiconductor memory device 300 shown in FIG. 6, in accordance with some embodiments of the present invention. FIG. 7 may correspond to an embodiment of the synchronous semiconductor memory device 300 that operates at a high frequency and with the input data DIN having a burst length of four. Accordingly, the clock signal CLOCK shown in FIG. 7 has a period tCC2 that is smaller than the period tCC1 of the clock signal CLOCK shown in FIG. 2.

Operation of the synchronous semiconductor memory device 300 will now be further described with reference to FIGS. 6 and 7. When an active command ACTIVE COMMAND is input synchronously with a rising edge of a first cycle C1 of the clock signal CLOCK, an active signal PACTIVE is activated to a high level. The data strobe input buffer 310 then buffers the data strobe signal DS and generates a delayed internal data strobe signal PDS.

The data strobe signal DS transitions from a high impedance (Hi-z) state to a low level during a preamble time interval PA, switches four times between a high level and a low level every a half period, and then transitions to the high impedance (Hi-z) state. Here, the time interval PA is a preamble time interval. The input data DIN is input from an external to the synchronous semiconductor memory device 200 synchronously with the rising and falling edges of the data strobe signal DS.

The detection signal DET is activated to a high level based on the data strobe signal DS having a low level in the preamble time interval PA. The detection signal DET is transitioned to a high impedance (Hi-z) state when the data strobe signal DS is transitioned to a high impedance (Hi-z) state.

The enable signal EN2 is activated to a high level in response to activation of the detection signal DET. The enable signal EN2 enables the data input buffer 330. The enabled data input buffer 330 buffers the input data DIN and generates the delayed first internal input data PDIN. The write signal PWRITE is activated to a high level during a predetermined time period by a write command WRITE COMMAND input synchronously with the rising edge of the third cycle C3 of the clock signal CLOCK and maintains the enable signal EN2 at a high level. The data input buffer 330 then continuously generates the first internal input data PDIN. When the write signal PWRITE is inactivated to a low level, the enable signal EN2 is inactivated to a low level. The first internal input data PDIN are latched by rising and falling edges of the internal data strobe signal PDS.

Because the synchronous semiconductor memory device 300 generates the enable signal EN2 which enables the data input buffer 330, even at a relatively higher frequency, the input data DIN may be more accurately written into memory cells of a memory cell array 360.

Figure 8:
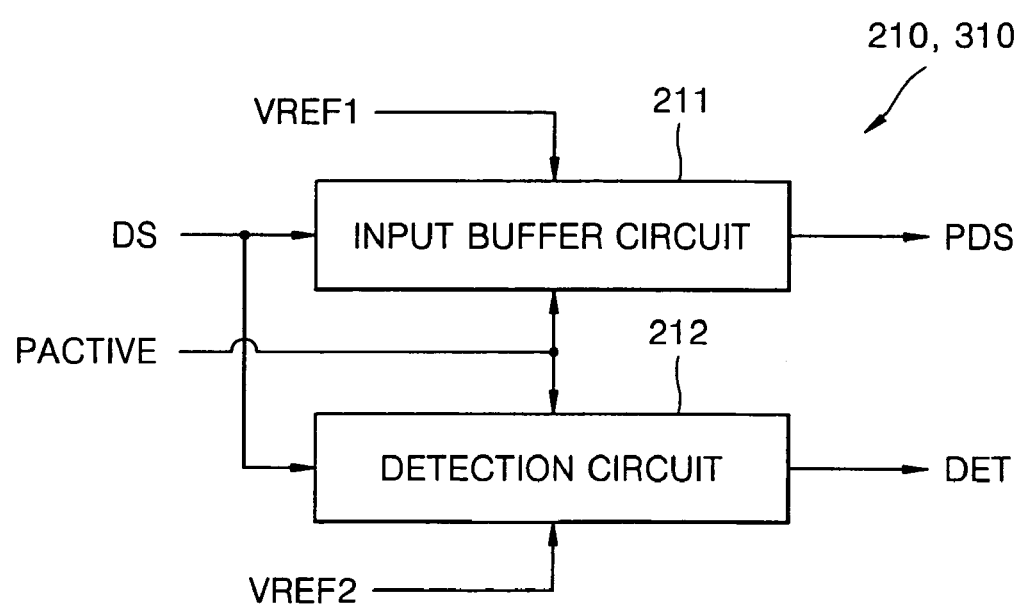
FIG. 8 is a block diagram of a data strobe input buffer in accordance with some embodiments of the present invention.

FIG. 8 is a block diagram showing a data strobe input buffer, which may be used as the data strobe buffer 210 show in FIG. 4 and/or the data strobe input buffer 310 in FIG. 6, in accordance with some embodiments of the present invention. The data strobe input buffer 210 or 310 comprises an input buffer circuit 211 and a detection circuit 212.

The input buffer circuit 211 is enabled based on the active signal PACTIVE and compares the data strobe signal DS with the first reference voltage VREF1 to generate the delayed internal data strobe signal PDS. The input buffer circuit 211 may include one or more differential amplifiers with input terminals and an output terminal. A differential amplifier in the input buffer circuit 211 may generate the internal data strobe signal PDS through its output terminal based on the data strobe signal DS and the first reference voltage VREF1 applied to its input terminals.

The detection circuit 212 is enabled based on an active signal PACTIVE, and compares the data strobe signal DS with the second reference voltage VREF2 to generate the detection signal DET, which can enable the data input buffers 230 and 330. The second reference voltage VREF2 can have a lower voltage level than the first reference voltage VREF1 and the data strobe signal DS.

The detection circuit 212 may include one or more differential amplifiers with input terminals and an output terminals. The differential amplifier(s) in the detection circuit 212 may be smaller than the differential amplifier(s) in the input buffer circuit 211. A differential amplifier in the detection circuit 212 may generate the detection signal DET through its output terminal based on the data strobe signal DS and the second reference voltage VREF2 applied to its input terminals.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A data strobe input buffer of a synchronous semiconductor memory device having a data input buffer, the data strobe input buffer comprising:
    an input buffer circuit that is configured to be enabled based on an active signal, and to compare a data strobe signal with a first reference voltage to generate an internal data strobe signal; and
    a detection circuit that is configured to be enabled based on the active signal, and to compare the data strobe signal with a second reference voltage to generate a detection signal for enabling the data input buffer.

2. The data strobe input buffer according to claim 1, wherein the second reference voltage has a lower voltage level than the data strobe signal.

3. The data strobe input buffer according to claim 2, wherein the second reference voltage has a lower voltage level than the first reference voltage.

4. The data strobe input buffer according to claim 1, wherein:
    the input buffer circuit and the detection circuit each comprise a differential amplifier with input terminals and an output terminal;
    the differential amplifier in the input buffer circuit generates the internal data strobe signal through its output terminal based on the data strobe signal and the first reference voltage applied to its input terminals; and
    the differential amplifier in the detection circuit generates the detection signal through its output terminal based on the data strobe signal and the second reference voltage applied to its input terminals.

5. A synchronous semiconductor memory device comprising:
    a data strobe input buffer that is configured to be enabled based on an active signal, to compare a data strobe signal with a first reference voltage to generate an internal data strobe signal, and to compare the data strobe signal with a second reference voltage to generate a detection signal;
    a first latch circuit that is configured to latch the detection signal, and to output an enable signal;
    a data input buffer that is configured to be enabled based on the enable signal, and to buffer input data to generate a first internal input data;
    a second latch circuit that is configured to latch the first internal input data in response to rising and falling edges of the internal data strobe signal to output second internal input data; and
    a memory cell array that comprises memory cells, wherein the second internal input data are written into the memory cells.

6. The synchronous semiconductor memory device according to claim 5, wherein the data strobe input buffer comprises:
    an input buffer circuit that is configured to be enabled based on the active signal, and to compare the data strobe signal with the first reference voltage to generate the internal data strobe signal; and
    a detection circuit that is configured to be enabled based on the active signal, and to compare the data strobe signal with the second reference voltage to generate the detection signal.

7. The synchronous semiconductor memory device according to claim 6, wherein:
    the input buffer circuit and the detection circuit each comprise a differential amplifier with input terminals and an output terminal;
    the differential amplifier in the input buffer circuit generates the internal data strobe signal through its output terminal based on the data strobe signal and the first reference voltage applied to its input terminals; and
    the differential amplifier in the detection circuit generates the detection signal through its output terminal based on the data strobe signal and the second reference voltage applied to its input terminals.

8. The synchronous semiconductor memory device according to claim 5, wherein the second reference voltage has a lower voltage level than the data strobe signal.

9. The synchronous semiconductor memory device according to claim 8, wherein the second reference voltage has a lower voltage level than the first reference voltage.

10. A synchronous semiconductor memory device comprising:
    a data strobe input buffer that is configured to be enabled based on an active signal, to compare a data strobe signal with a first reference voltage to generate an internal data strobe signal, and to compare the data strobe signal with a second reference voltage to generate a detection signal;
    a logic circuit that is configured to generate an enable signal based on the detection signal and a write signal;
    a data input buffer that is configured to be enabled based on the enable signal, and to buffer input data to generate a first internal input data;
    a latch circuit that is configured to latch the first internal input data in response to rising and falling edges of the internal data strobe signal to output second internal input data; and
    a memory cell array that comprises memory cells, wherein the second internal input data are written into the memory cells.

11. The synchronous semiconductor memory device according to claim 10, wherein the data strobe input buffer comprises:
    an input buffer circuit that is configured to be enabled based on the active signal, and to compare the data strobe signal with the first reference voltage to generate the internal data strobe signal; and
    a detection circuit that is configured to be enabled based on the active signal, and to compare the data strobe signal with the second reference voltage to generate the detection signal.

12. The synchronous semiconductor memory device according to claim 11, wherein:
    the input buffer circuit and the detection circuit each comprise a differential amplifier with input terminals and an output terminal;

the differential amplifier in the input buffer circuit generates the internal data strobe signal through its output terminal based on the data strobe signal and the first reference voltage applied to its input terminals; and the differential amplifier in the detection circuit generates the detection signal through its output terminal based on the data strobe signal and the second reference voltage applied to its input terminals.

13. The synchronous semiconductor memory device according to claim 12, wherein the second reference voltage has a lower voltage level than the data strobe signal.

14. The synchronous semiconductor memory device according to claim 10, wherein the second reference voltage has a lower voltage level than the first reference voltage.

15. The synchronous semiconductor memory device according to claim 10, wherein the logic circuit is configured to activate the enable signal based on activation of the detection signal, to maintain activation of the enable signal based on activation of the write signal, and to deactivate the enable signal based on inactivation of the write signal.

16. The synchronous semiconductor memory device according to claim 10, wherein the logic circuit comprises a NAND gate.

17. The synchronous semiconductor memory device according to claim 10, wherein the logic circuit comprises a NOR gate.

* * * * *